United States Patent

Kuchta et al.

[19]

[11] Patent Number: 6,111,430
[45] Date of Patent: Aug. 29, 2000

[54] CIRCUIT FOR INTERFACING A FIRST TYPE OF LOGIC CIRCUIT WITH A SECOND TYPE OF LOGIC CIRCUIT

[75] Inventors: Daniel M. Kuchta, Cortlandt Manor; Jungwook Yang, West Nyack, both of N.Y.

[73] Assignee: International Business Machines Corporation, Armonk, N.Y.

[21] Appl. No.: 09/104,602

[22] Filed: Jun. 24, 1998

[51] Int. Cl.$^7$ .................. H03K 19/0175; H03K 19/094; H03K 19/20

[52] U.S. Cl. ............................ 326/68; 326/83; 326/116; 326/121

[58] Field of Search ................................ 326/63, 68, 82, 326/83, 86, 112, 116, 117, 119, 121

[56] References Cited

U.S. PATENT DOCUMENTS

| | | | |
|---|---|---|---|
| 4,810,907 | 3/1989 | Tohyama | 326/68 |
| 4,812,683 | 3/1989 | Fitzpatrick et al. | 326/72 |
| 4,853,561 | 8/1989 | Gravrok | 326/25 |
| 5,045,727 | 9/1991 | Danckaert et al. | |
| 5,286,985 | 2/1994 | Taddiken. | |
| 5,420,527 | 5/1995 | Naber | 326/32 |
| 5,705,940 | 1/1998 | Newman et al. | 326/68 |

*Primary Examiner*—Michael Tokar
*Assistant Examiner*—James A. Cho
*Attorney, Agent, or Firm*—F. Chau & Associates, LLP

[57] ABSTRACT

A circuit for interfacing CMOS logic devices, having an output level range associated therewith, with MESFET logic devices, having an input level range associated therewith, comprises a depletion mode MESFET device, coupled between at least one CMOS device and at least one other MESFET device, the depletion mode MESFET device limiting a current through a gate-source junction thereof such that the output level range of the at least one CMOS device is altered to be compatible with the input level range of the at least one other MESFET device. Another circuit for interfacing CMOS logic devices, having an output level range associated therewith, with MESFET logic devices, having an input level range associated therewith, comprises: a source follower MESFET device coupled to an output terminal of at least one CMOS device; a first depletion mode MESFET device, coupled to the source follower MESFET device, the first depletion mode MESFET device limiting a current through a gate-source juction thereof such that the output level range of the at least one CMOS device is altered to be compatible with the input level range of at least one other MESFET device; and a second depletion mode MESFET device, coupled to the first depletion mode MESFET device, for providing a discharge path; wherein an input terminal of the at least one other MESFET device is coupled between the first and second depletion mode MESFET devices.

11 Claims, 4 Drawing Sheets

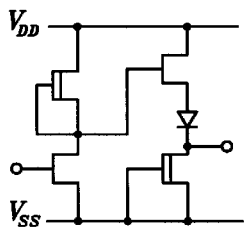 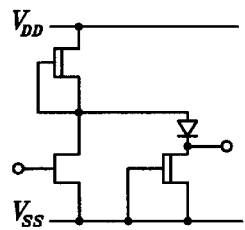 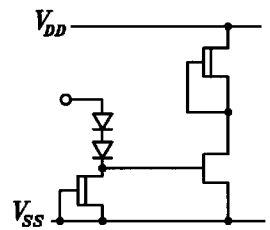
FIG. 1(a) BFL     FIG. 1(b) FL     FIG. 1(c) SDFL
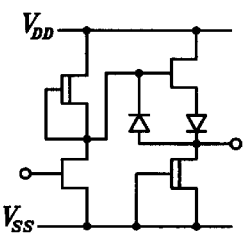 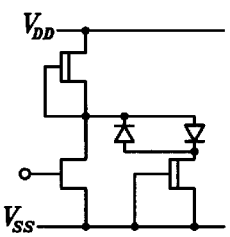 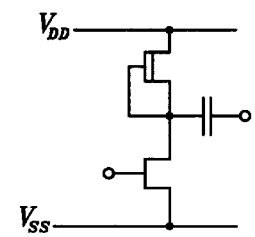 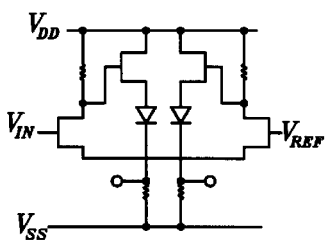
FIG. 1(d) FFFL    FIG. 1(e) CDFL    FIG. 1(f) CCFL    FIG. 1(g) SCFL
FIG. 1 MESFET logic approach (Prior Art)
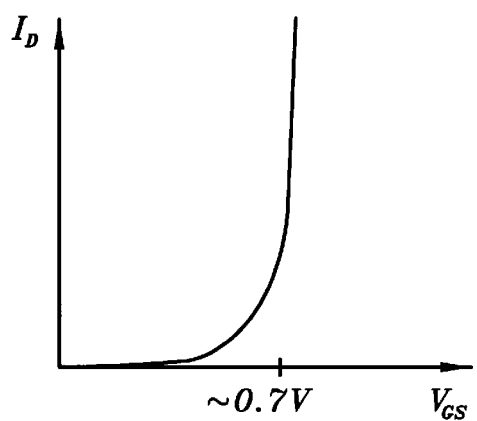
FIG. 2 I-V characteristics of gate-source diode (Prior Art)

FIG. 3 Conventional CMOS level to MESFET logic level interface circuit (Prior Art)

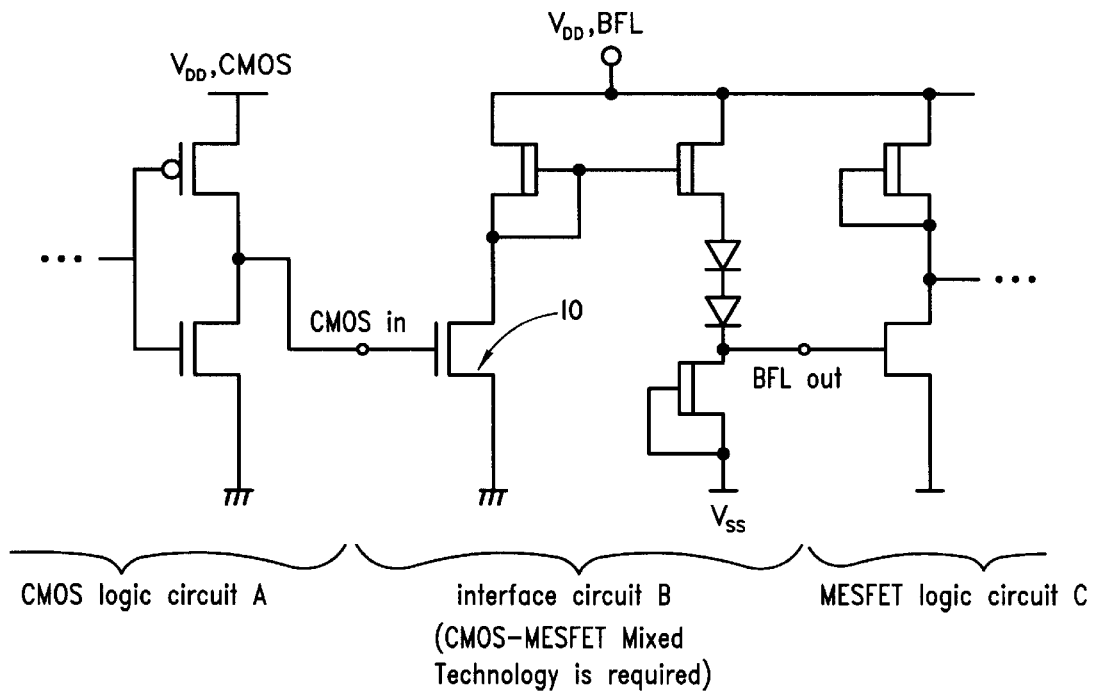
FIG. 4(a) CMOS to MESFET logic interface circuit using CMOS-MESFET mixed technology (Prior Art)
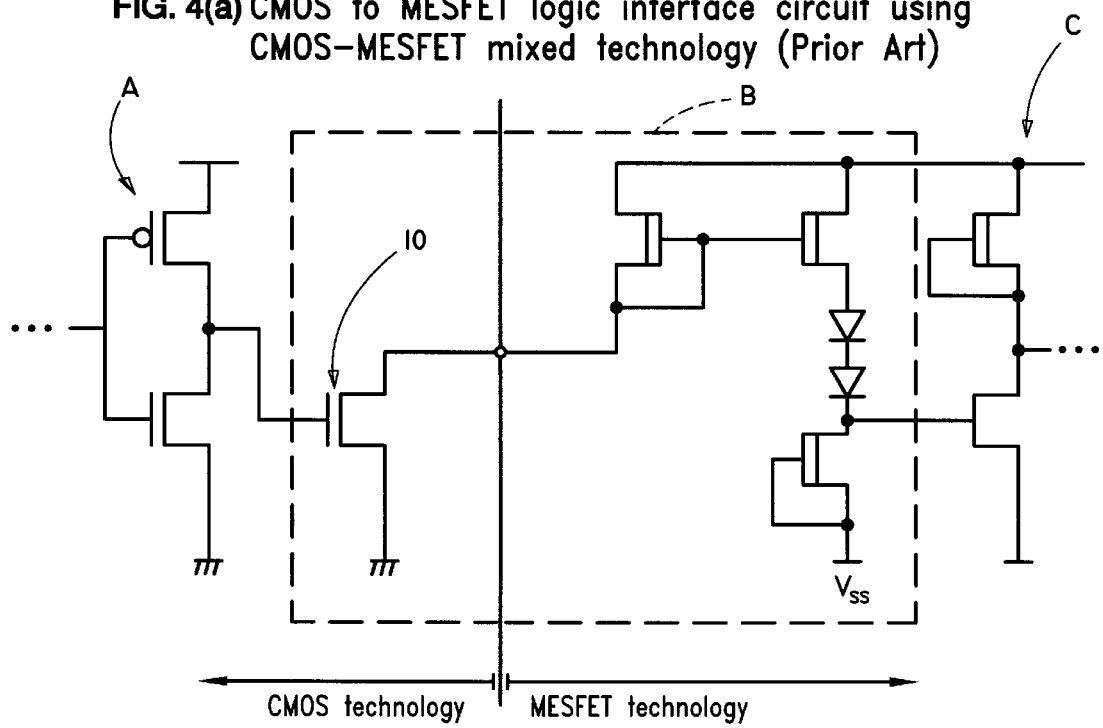
FIG. 4(b) Interface circuit in separate CMOS & MESFET technologies (Prior Art)

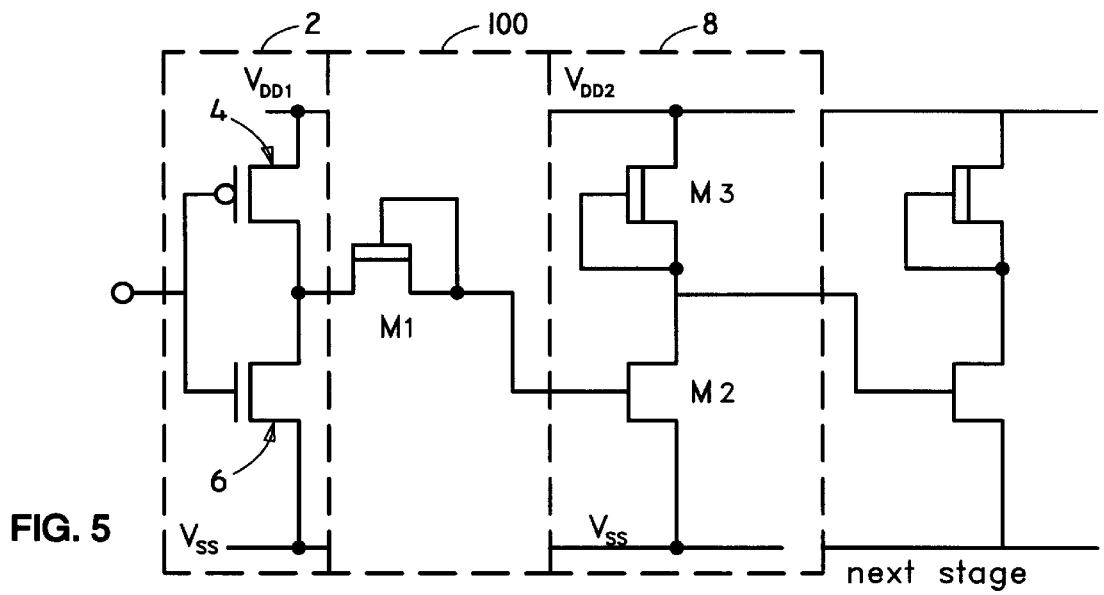
FIG. 5
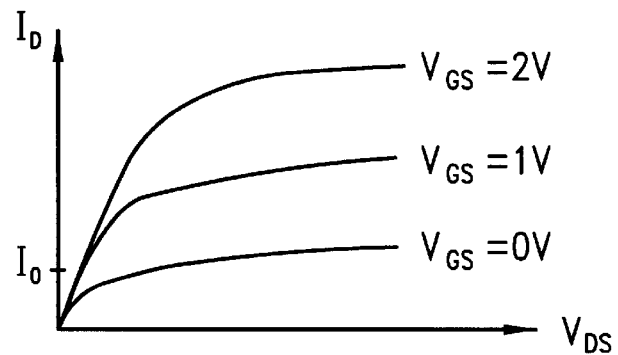
FIG. 6 I-V characteristics of M1 ($V_T < 0$)
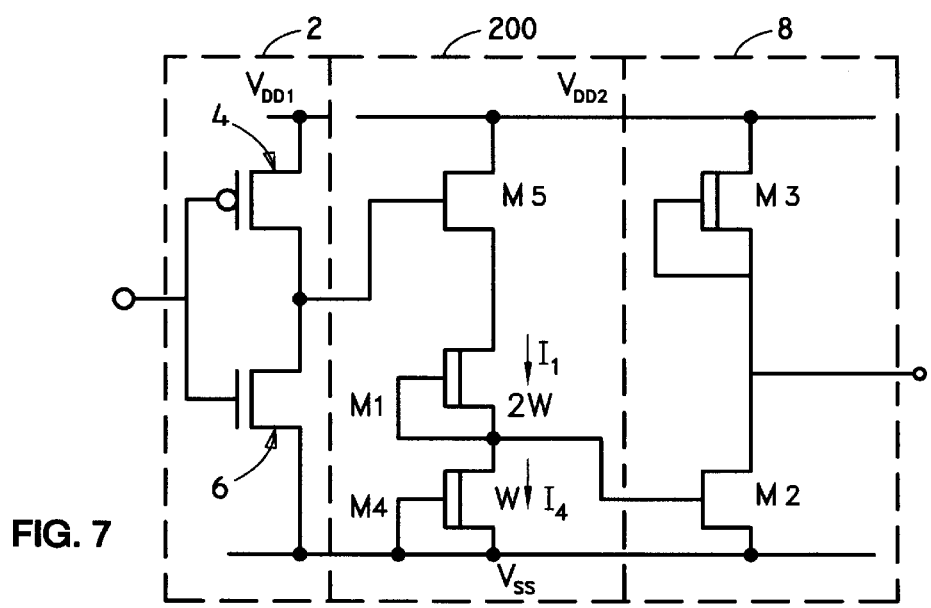
FIG. 7

CIRCUIT FOR INTERFACING A FIRST TYPE OF LOGIC CIRCUIT WITH A SECOND TYPE OF LOGIC CIRCUIT

BACKGROUND OF THE INVENTION

The present invention relates to circuits for interfacing a first type of logic circuit with a second type of logic circuit and, more particularly, to circuits for interfacing such logic circuits wherein the first type of logic circuit has a larger output logic level swing as compared to the input logic level swing of the second type of logic circuit.

It is known that III–V compound MESFET (metal semiconductor field effect transistor) circuits such as GaAs (gallium arsenide) MESFET logic circuits are widely used for high-speed applications such as optical data connections having a data rate up to several tens of Gigahertz. The optical data links are used for data communication in distributed computer systems or clustered systems as system area networks.

From the system point of view, the controls to the GaAs MESFET logic circuit are coming from the system (e.g., distributed computer system or clustered system), which is usually built with silicon-based CMOS (complementary metal oxide semiconductor) logic. Thus, silicon CMOS logic to MESFET logic interface circuitry is typically necessary.

FIG. 1 shows the logic family of MESFET logic gates: (a) buffered field effect transistor logic (BFL); (b) field effect transistor logic (FL); (c) Schottky diode field effect transistor logic (SDFL); (d) feed forward field effect transistor logic (FFFL); (e) capacitor diode field effect transistor logic (CDFL); (f) capacitor coupled field effect transistor logic (CCFL); and (g) source coupled field effect transistor logic (SCFL). The gate-source junction of a MESFET is a forward biased diode when a positive voltage is applied at the gate to turn the transistor on. Since the input of the MESFET logic is directly to the gate of a MESFET as shown in FIG. 1, the input swing should be limited from GND to 0.7V. Otherwise, the input voltage will forward-bias the gate-source diode resulting in a very large gate-source current such as several milliamps (mA) to several tens of milliamps, depending on the design, due to the exponential characteristic of current versus voltage as shown in FIG. 2. In order to apply a rail-to-rail CMOS logic output to the MESFET logic, the CMOS logic "high" should be reduced or clamped less than 0.6V, but higher than the threshold voltage of the MESFET, which is for example 0.2V.

FIG. 3(a) and (b) illustrate examples of conventional CMOS to MESFET logic interface circuits. These conventional interface circuits use several fixed diode on-voltage drops (denoted as n), and are only good for a fixed supply voltage. In system applications, typically ±10% of the supply voltage margin should be allowed. If the supply voltage is 5 volt (V), the margin in the supply voltage is ±0.5V yielding a total difference of 1V, which is even more than one diode voltage drop. So, the voltage drop through the fixed number of diodes can easily exceed the diode on-voltage and, again, due to the exponential characteristics of current versus voltage as shown in FIG. 2, the current is very large and results in high power consumption.

U.S. Pat. No. 5,286,985 to Taddiken discloses an interface circuit for connecting GaAs circuits with silicon circuits using a mix of GaAs and silicon devices. An exemplary illustration of such an approach is shown in FIG. 4(a) where CMOS logic circuit A is interfaced to MESFET logic circuit C via mixed technology interface circuit B. However, this approach is applicable only to GaAs and CMOS mixed technology because the interface circuit, itself, includes both CMOS devices and MESFET devices. Even if this interface circuit were designed in separated CMOS and GaAs technologies, as illustrated in FIG. 4(b), the CMOS logic circuit A, which is an open-drain output, would still require that the CMOS transistor 10 be in the interface circuit B, as denoted by the phantom box in FIG. 4(b). Hence, this interface circuit would be useful only if the CMOS open-drain output circuit A was specifically designed to use this interface circuit. However, as completed CMOS systems do not usually support open-drain output, the Taddiken interface circuit is not applicable for most cases.

Accordingly, it would be highly advantageous to provide a circuit for interfacing a first type of logic circuit with a second type of logic circuit wherein the interface circuit is composed of only logic devices of the second type capable of receiving typical output signals from logic devices of the first type. Such an inventive interface circuit would enable the easy separation of the two types of circuit technology.

SUMMARY OF THE INVENTION

In one aspect of the invention, a circuit for interfacing first and second types of logic devices, the first type of logic devices having a higher output level range than an input level range of the second type of logic devices, comprises at least one logic device of the second type, coupled between at least one logic device of the first type and at least a second logic device of the second type, the at least one logic device of the second type limiting a current therethrough such that the output level range of the first type logic device is altered to be compatible with the input level range of the second type logic device. Preferably, the at least one logic device of the second type is independent of supply voltages associated with the first and second logic devices.

In another aspect of the invention, a circuit for interfacing CMOS logic devices, having an output level range associated therewith, with MESFET logic devices, having an input level range associated therewith, comprises a depletion mode MESFET device, coupled between at least one CMOS device and at least one other MESFET device, the depletion mode MESFET device limiting a current through a gate-source junction thereof such that the output level range of the at least one CMOS device is altered to be compatible with the input level range of the at least one other MESFET device.

In yet another aspect of the invention a circuit for interfacing CMOS logic devices, having an output level range associated therewith, with MESFET logic devices, having an input level range associated therewith, comprises: a source follower MESFET device coupled to an output terminal of at least one CMOS device; a first depletion mode MESFET device, coupled to the source follower MESFET device, the first depletion mode MESFET device limiting a current through a gate-source junction thereof such that the output level range of the at least one CMOS device is altered to be compatible with the input level range of at least one other MESFET device; and a second depletion mode MESFET device, coupled to the first depletion mode MESFET device, for providing a discharge path; wherein an input terminal of the at least one other MESFET device is coupled between the first and second depletion mode MESFET devices.

Preferably, a width associated with the first depletion mode MESFET device is larger than a width associated with the second depletion mode MESFET device so that the difference of the respective currents flowing therethrough is output from the interface circuit in response to a high input level at the input of the interface circuit.

These and other objects, features and advantages of the present invention will become apparent from the following detailed description of illustrative embodiments thereof, which is to be read in connection with the accompanying drawings in which the same reference numerals are used throughout the various figures to designate same or similar components.

BRIEF DESCRIPTION OF THE DRAWINGS

FIGS. 1(a) through (g) are schematic diagrams illustrating the logic family of MESFET logic gates;

FIG. 2 is a graph illustrating I–V (current versus voltage) characteristics of a gate-source diode of a MESFET device;

FIGS. 4(a) and (b) are schematic diagrams illustrating conventional CMOS logic level to MESFET logic level interface circuits using CMOS-MESFET mixed technology;

FIG. 5 is a schematic diagram illustrating one embodiment of an interface circuit of the invention;

FIG. 6 is a graph illustrating I–V (current versus voltage) characteristics of transistor M1 in FIG. 5; and FIG. 7 is a schematic diagram illustrating another embodiment of an interface circuit of the invention.

DETAILED DESCRIPTION OF PREFERRED EMBODIMENTS

Figure 3A:
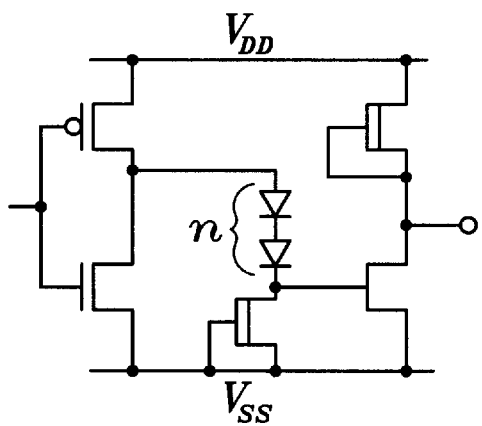
FIGS. 3(a) and (b) are schematic diagrams illustrating prior art CMOS logic level to MESFET logic level interface circuits.
Figure 3B:
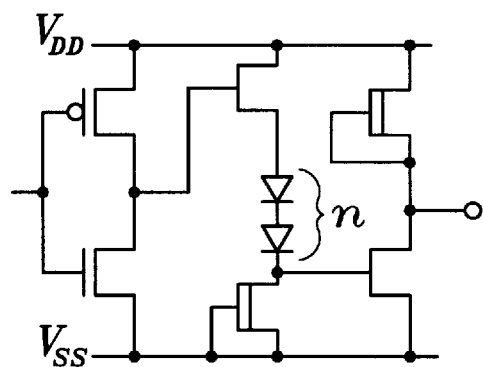

Referring now to FIG. 5, one embodiment of an interface circuit of the present invention is illustrated. The interface circuit 100 is coupled between and interfaces a CMOS logic output circuit 2 to a MESFET logic input circuit 8. As is known and previously mentioned, the need for the interface circuit is due to the fact that the output logic level swing (i.e., range) of the CMOS circuit 2 (GND to 5V) is larger than the input logic level swing (i.e., range) permitted by the MESFET input circuit 8 (GND to 0.7V).

The CMOS logic output circuit 2 includes pFET device 4 and nFET device 6, each having gate, source and drain terminals. The gates of the FET devices 4 and 6 are coupled to form an input terminal of the circuit 2, while the drain of device 4 is coupled to the drain of device 6 to form an output terminal of the circuit 2. The source of the device 4 is coupled to a supply voltage $V_{DD1}$ and the source of the device 6 is coupled to a supply voltage $V_{SS}$. The output terminal of the CMOS circuit 2 is coupled to an input terminal of the interface circuit 100.

On the other hand, the MESFET input circuit 8 includes a MESFET device M2 and a depletion mode MESFET (D-MESFET) device M3, each having gate, source and drain terminals, as is found in most of those in FIG. 1. The gate of M2 is coupled to an output terminal of the interface circuit 100. The drain of M2 and the source of M3 are coupled to form an output terminal of the MESFET circuit 8. The gate of M3 is coupled to its source. Further, the drain of M3 is coupled to the voltage supply of the MESFET circuit, $V_{DD2}$. It is to be appreciated that $V_{DD1}$ and $V_{DD2}$ can be the same. Likewise, the source of M2 is coupled to the same voltage supply as the source of the pFET device 6, i.e., $V_{SS}$.

The interface circuit 100 consists of a single depletion mode MESFET device M1 having gate, source and drain terminals. As is evident, the interface circuit 100 is independent of the supply voltages associated with the CMOS circuit 2 and the MESFET circuit 8. The drain of M1, coupled to the output terminal of the CMOS circuit 2, serves as the input terminal of the interface circuit 100, while the source of M1, coupled to the MESFET circuit 8, serves as the output terminal of the interface circuit 100. The gate and source of M1 are coupled to each other. It is to be appreciated that the D-MESFET M1 limits the current therethrough. Due to the depletion transistor configuration, the gate-source voltage of M1 is fixed and the threshold voltage associated with M1 is negative, for example, −0.2V. Thus, the current through the gate-source junction (diode) is fixed because the gate-source voltage is fixed to 0V. Further, the current through the transistor M1 is determined by the geometry (width/length) of the transistor. Typically, the geometry of M1 can be made the same as that of M3. M3 supplies current to a next MESFET stage (FIG. 5) when the output of circuit 8 is logic "high". In the same way, the current through M1 is used to pull up the gate of M2 (if faster operation is desired, M1 can have a larger width/length ratio). A typical example of the current and the size of M1 is about 100 $\mu$A and about 10 $\mu$m/1 $\mu$m, but it depends on the operation speed in the application and the technology. The drain-source voltage of M1 cannot affect the current significantly because of the drain voltage versus current characteristics associated with M1, as shown in FIG. 6. M1 works as a current source, and absorbs the voltage difference between the CMOS circuit and the MESFET circuit. It relates two different voltage levels with a fixed current level. Accordingly, the current through M1 to the gate-source diode of M2 is an acceptable level as in M3.

For example, if $V_{DD1}=V_{DD2}=5V$, the output of circuit 2 is 5V at logic "high", and the current through M1 is determined by the geometry and the technology. The current turns on the gate-source diode of M2, resulting in a gate-source voltage of about 0.7V. However, the current through the gate-source diode is limited by the design characteristics of M1, for example, to about 100 $\mu$A.

Referring now to FIG. 7, another embodiment of an interface circuit of the present invention is illustrated. In this embodiment, the interface circuit 200 is coupled between and interfaces the CMOS logic output circuit 2 to the MESFET logic input circuit 8. Circuits 2 and 8 are configured as shown and explained in the context of FIG. 5.

The interface circuit 200 consists of depletion mode MESFET devices M1 and M4 and MESFET device M5. The gate of M5, serving as the input terminal of the interface circuit 200, is coupled to the output terminal of the CMOS circuit 2, while the drain of M5 is coupled to $V_{DD2}$. The source of M5 is coupled to the drain of M1. The gate of M1 is coupled to its own source, which is coupled to the drain of M4. This junction forms the output terminal of the interface circuit 200 which is coupled to the input terminal of the MESFET circuit 8. The gate of M4 is coupled to its own source, which is coupled to $V_{SS}$.

This second embodiment provides a high impedance input by employing M5 in a source follower arrangement. It is to be appreciated that M1 limits the current into the gate-source diode of M2. However, when the signal input to the interface circuit 200 goes to a logic "low" level and M5 does not conduct, there is no discharge path to the ground ($V_{SS}$) without M4. Thus, M4 is used to establish such a discharge path. It is further to be appreciated that the sizes (width/length) of the transistors M1 and M4 should be chosen such that the current at M4 is smaller than M1. Preferably, the acceptable width of M4 is about half of M1.

For example, if $V_{DD1}=V_{DD2}=5V$, and the output of the CMOS circuit 2 is logic "high", the gate of M5 is 5V. If the threshold voltage of the enhancement mode MESFETs M5 and M2 are 0.2V, the drain voltage of M1 is now 4.8V. The current through M1 goes to the gate-source diode of M2 and turns it on, resulting in a source voltage of about 0.7V. The drain-source voltage of M1 is 4.1V, but as in the I–V characteristics of depletion mode transistors as shown in FIG. 6, the current through M1 is still constant as determined by the geometry of the transistor M1 and the technology. A typical current level to charge the gate of M2 is the same as that of M3, for example, 100 µA. The current difference through M1 ($I_1$) and M4 ($I_4$) goes to the gate of M2, and is preferably designed to be about 100 µA. Also, in order to have the same current level to charge and discharge the gate of M2, the current through M1 needs to be about twice as large as that through M4. Hence, the current level of M4 is selected to be about 100 µA, and that of M1 is about 200 µA. The geometry of M4 is the same as M3, and M1 is twice as wide as M4, while the length of the channel is the same.

When the output of the CMOS circuit 2 is switched to logic "low" from "high", the voltage of the gate of M5 is 0V, and then M5 is cut off. The discharge path of the gate of M2 is now formed through M4. Initially, the drain voltage of M4 is 0.7V when the input of interface circuit 200 goes logic "low" from "high". The voltage goes low as the discharge progresses, and eventually the drain voltage of M4 becomes 0V when the discharge is completed.

It is to be understood that while the above embodiments illustrate interface circuits for interfacing between CMOS circuits and MESFET circuits, the teachings of the invention are applicable to interfacing any first type of logic circuit with any second type of logic circuit, wherein the first type of logic circuit has a larger output logic level swing as compared to the input logic level swing of the second type of logic circuit. That is, the interface circuits of the invention can be used for all junction FET logic such as, for example, GaAs MESFETs, JFETs, and so on.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A circuit for interfacing first and second types of logic devices, the first type of logic devices having a higher output level range than an input level range of the second type of logic devices, the circuit consisting essentially of:

an interfacing logic device, of a type the same as the second type, capable of receiving signals output from the logic devices of the first type, the interfacing logic device being coupled between at least one logic device of the first type and at least a second logic device of the second type, the interfacing logic device for limiting a current therethrough such that the output level range of the first type logic device is altered to be compatible with the input level range of the second type logic device.

2. The circuit of claim 1, wherein the first type of logic devices are CMOS devices.

3. The circuit of claim 1, wherein the second type of logic devices are MESFET devices.

4. The circuit of claim 1, wherein the interfacing logic device of the second type is a depletion mode MESFET device.

5. The circuit of claim 1, wherein the interfacing logic device of the second type is independent of supply voltages associated with the first and second logic devices.

6. A circuit for interfacing CMOS logic devices, having an output level range associated therewith, with MESFET logic devices, having an input level range associated therewith, the circuit consisting essentially of:

a depletion mode MESFET device, coupled between at least one CMOS device and at least one other MESFET device, the depletion mode MESFET device limiting a current through a gate-source junction thereof such that the output level range of the at least one CMOS device is altered to be compatible with the input level range of the at least one other MESFET device.

7. The circuit of claim 6, wherein the depletion mode MESFET device is independent of supply voltages associated with the at least one CMOS device and the at least one other MESFET device.

8. The circuit of claim 6, wherein the depletion mode MESFET device has gate, source and drain terminals wherein the drain terminal is coupled to an output terminal of the at least one CMOS device and further wherein the gate and source terminals are both coupled to an input terminal of the at least one other MESFET device.

9. A circuit for interfacing CMOS logic devices, having an output level range associated therewith, with MESFET logic devices, having an input level range associated therewith, the circuit comprising:

a source follower MESFET device coupled to an output terminal of at least one CMOS device;

a first depletion mode MESFET device, coupled to the source follower MESFET device, the first depletion mode MESFET device limiting a current through a gate-source junction thereof such that the output level range of the at least one CMOS device is altered to be compatible with the input level range of at least one other MESFET device; and a second depletion mode MESFET device, coupled to the first depletion mode MESFET device, for providing a discharge path;

wherein an input terminal of the at least one other MESFET device is coupled between the first and second depletion mode MESFET devices.

10. The circuit of claim 9, wherein the first depletion mode MESFET device is independent of supply voltages associated with the at least one CMOS device and the at least one other MESFET device.

11. The circuit of claim 9, wherein a width associated with the first depletion mode MESFET device is larger than a width associated with the second depletion mode MESFET device.

* * * * *

UNITED STATES PATENT AND TRADEMARK OFFICE
CERTIFICATE OF CORRECTION

PATENT NO.: 6,111,430

DATED: August 29, 2000

INVENTOR(S): Kuchta et al.

It is certified that error appears in the above-identified patent and that said Letters Patent is hereby corrected as shown below:

Column 1, line 4, after the title, insert "STATEMENT OF GOVERNMENT RIGHTS" and, in the next paragraph, "This invention was made with Government support under grant contract number 70NANB4H1521 awarded by the National Institute of Standards and Technology (NIST). The Government has certain rights in the invention."

Signed and Sealed this

Twenty-fourth Day of April, 2001

*Attest:*

NICHOLAS P. GODICI

*Attesting Officer*   *Acting Director of the United States Patent and Trademark Office*